United States Patent
Lee

(10) Patent No.: US 8,355,431 B2
(45) Date of Patent: Jan. 15, 2013

(54) DECISION FEEDBACK EQUALIZER HAVING CLOCK RECOVERY CIRCUIT AND METHOD FOR RECOVERING CLOCK

(75) Inventor: Ki-Hyuk Lee, Gyeonggi-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 1066 days.

(21) Appl. No.: 12/327,605

(22) Filed: Dec. 3, 2008

(65) Prior Publication Data

US 2010/0061440 A1  Mar. 11, 2010

(30) Foreign Application Priority Data

Sep. 8, 2008 (KR) .................. 10-2008-0088326

(51) Int. Cl.
*H03H 7/30* (2006.01)
(52) U.S. Cl. ........ 375/233; 375/229; 375/230; 375/231; 375/232; 375/237; 375/376; 327/107; 327/57; 327/166; 327/176; 327/202; 327/311
(58) Field of Classification Search .................. 375/233, 375/229, 230, 231, 232, 237, 376, 107, 57, 375/166, 176, 202, 311
See application file for complete search history.

(56) References Cited

U.S. PATENT DOCUMENTS

| | | | |
|---|---|---|---|
| 7,151,796 B2 | 12/2006 | Allpress et al. | |
| 2002/0003874 A1* | 1/2002 | Peiker | 379/419 |
| 2005/0135470 A1 | 6/2005 | Momtaz | |
| 2005/0135471 A1* | 6/2005 | Tonietto et al. | 375/233 |
| 2005/0180498 A1 | 8/2005 | Bhakta et al. | |
| 2006/0233291 A1 | 10/2006 | Garlepp et al. | |

OTHER PUBLICATIONS

Notice of Allowance issued from Korean Intellectual Property Office on May 26, 2010.
Office Action and Search Report by the Taiwanese Intellectual Property Office on Jun. 25, 2012.

\* cited by examiner

*Primary Examiner* — Zewdu Kassa
(74) *Attorney, Agent, or Firm* — IP & T Group LLP

(57) ABSTRACT

A Decision Feedback Equalizer (DFE) capable of preventing incremental increases of a jitter of a recovered clock and reduction of a voltage margin of decided data due to delay of feedback data. The DFE includes a combiner for combining received data with feedback data and outputting the combined data as equalization data, a decision circuit for deciding recovery data by receiving the equalization data, a feedback loop for supplying the recovery data to the combiner as feedback data and a clock recovery circuit for removing a delay data component from the equalization data through the feedback loop, recovering a clock with respect to the other equalization data except the delay data component and supplying the recovered clock for decision operation of the decision circuit.

15 Claims, 8 Drawing Sheets

DECISION FEEDBACK EQUALIZER HAVING CLOCK RECOVERY CIRCUIT AND METHOD FOR RECOVERING CLOCK

CROSS-REFERENCE TO RELATED APPLICATIONS

The present invention claims priority of Korean patent application number 10-2008-0088326, filed on Sep. 8, 2008, respectively, which is incorporated by reference in its entirety.

BACKGROUND OF THE INVENTION

The present invention relates to a decision feedback equalizer of a high speed serial communication system, and more particularly, to clock recovery in a decision feedback equalizer.

In general, a decision feedback equalizer (hereinafter, which will be referred to as 'DFE' hereafter) plays a role of removing inter-symbol interference (hereinafter, which will be referred to as 'ISI' hereafter) due to high frequency channel loss in a high speed serial interface. The DFE removes interference components due to data that have been received previously and fed back from data received currently. Thus, equalization data is outputted to decide a value of the received data based on the equalization data. Such a DFE is used to remove the ISI generated in data inputted/outputted to/from a storage medium as well as the high speed serial interface between chips.

Meanwhile, feedback data of the DFE need to be fed back within a predetermined unit time, because, if the previous received data is not fed back within the predetermined unit time, edges between the current received data and the feedback data do not match, thereby causing another ISI in the equalization data. When the equalization data with the thus-caused ISI is inputted to a circuit for recovering a clock used for a feedback loop, the clock, which is gradually pushed backward, is recovered. That is, this makes a jitter of the recovered clock to increase. Furthermore, the delay in the feedback data increases in response to the clock, which is gradually pushed backward, thereby reducing the voltage margin of decided data.

Therefore, it is needed to prevent the increment of the jitter of the recovered clock due to the delay of the feedback data and reduction of the voltage margin of the decided data in the DFE.

SUMMARY OF THE INVENTION

Embodiments of the present invention are directed to providing a DFE and a method for recovering a clock capable of preventing increment of a jitter of a recovered clock due to delay of feedback data.

Embodiments of the present invention are directed to providing a DFE and a method for recovering a clock capable of preventing reduction of a voltage margin of decided data due to the delay of the feedback data.

In accordance with an aspect of the present invention, a DFE for a high speed serial communication system including the following items are provided: a combiner configured to combine received data with feedback data and output the combined data as equalization data; a decision circuit configured to decide recovery data by receiving the equalization data; a feedback loop configured to supply the recovery data to the combiner as feedback data; and a clock recovery circuit configured to detect whether edges exist prior to a window with a size previously defined at each edge of the equation data, recover a clock with respect to only the edges not detected and supply the recovered clock for decision operation of the decision circuit.

In accordance with another aspect of the present invention, there is provided a DFE for a high speed serial communication system including the following items are provided: a combiner configured to combine received data with feedback data and output the combined data as equalization data; a decision circuit configured to decide recovery data by receiving the equalization data; a feedback loop configured to supply the recovery data to the combiner as feedback data; and a clock recovery circuit configured to detect whether edges of feedback data components exist within a window with a size previously defined at each edge of the received data components of the equation data, recover a clock with respect to the edges of the received data components and the other edges of the feedback data components except the detected edges and supply the recovered clock for decision operation of the decision circuit.

In accordance with another aspect of the present invention, there is provided a DFE for a high speed serial communication system including the following items are provided: a combiner configured to combine received data with feedback data and output the combined data as equalization data; a decision circuit configured to decide recovery data by receiving the equalization data; a feedback loop configured to supply the recovery data to the combiner as feedback data; and a clock recovery circuit configured to remove a delay data component from the equalization data through the feedback loop, recover a clock with respect to the other equalization data except the delay data component and supply the recovered clock for decision operation of the decision circuit.

In accordance with another aspect of the present invention, there is provided a method for recovering a clock of a DFE for a high speed serial communication system with a combiner configured to combine received data with feedback data and output the combined data as equalization data, a decision circuit configured to decide recovery data by receiving the equalization data and a feedback loop configured to supply the recovery data to the combiner as feedback data including steps of: removing a delay data component from the equalization data through the feedback loop; recovering a clock with respect to the other equalization data except the delay data component; and supplying the recovered clock for decision operation of the decision circuit.

DESCRIPTION OF SPECIFIC EMBODIMENTS

Other objects and advantages of the present invention can be understood by the following description, and become apparent with reference to the embodiments of the present invention.

Hereafter, configuration of a conventional DFE, which is applied by the present invention, will be described, first. Then, the need of a new clock recovery circuit in the conventional DFE will be described. After that, configuration and operation of the clock recovery circuit in accordance with an embodiment of the present invention will be described.

Figure 1:
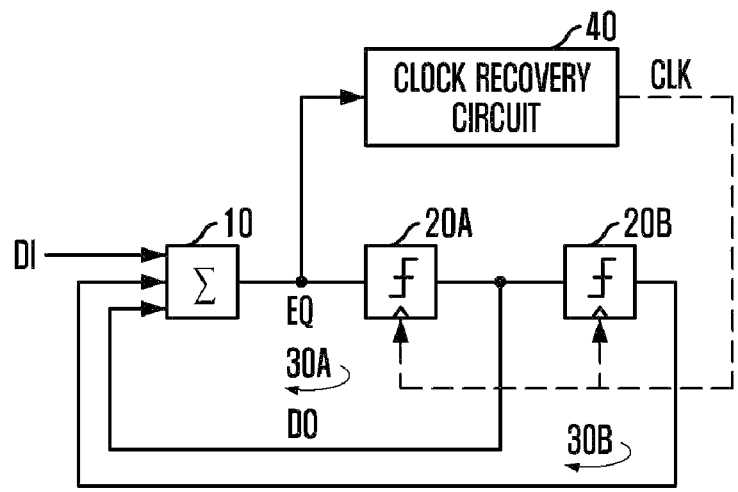
FIG. 1 is a block diagram illustrating a DFE in accordance with the present invention.

FIG. 1 is a block diagram illustrating a DFE according to the present invention. The block diagram illustrates the DFE constructed by 2-tap as one example.

Referring to FIG. 1, a combiner 10 combines received data DI with feedback data DO and outputs the combined data as equalization data EQ. The combiner 10 may be a differential combiner. Two tap decision circuits 20A and 20B decide recovery data by receiving the equalization data EQ. Feedback loops 30A and 30B supply the recovery data through the decision circuits 20A and 20B to the combiner 10 as feedback data respectively. The received data DI can be input/output data of a storage medium or data that is inputted/outputted through an interface between chips. A clock recovery circuit 40 receives the equalization data from the combiner 10, recovers a clock from the equalization data, and supplies the recovered clock for decision operation of the decision circuits 20A and 20B. The DFE decides a value of the recovery data through the decision circuits 20A and 20B after removing an interference component due to data received previously from current data received through the combiner 10. The decision operation is performed on the assumption that a value of the previous received data is right and as described above, feedback of data is executed.

Figure 2:
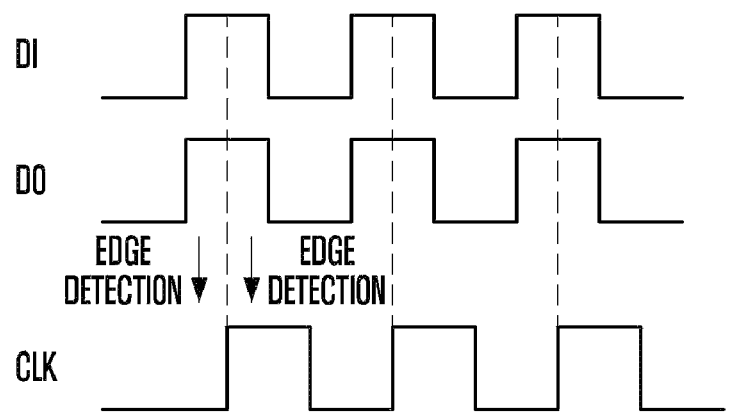
FIG. 2 is an ideal operation timing diagram in the DFE illustrated in FIG. 1.

If the feedback is ideally executed without delay, edges of the received data DI and the feedback data DO, as shown in FIG. 2, are exactly matched. Then, the clock recovery circuit 40 detects the edges of the data, aligns clocks with respect to the detected edges and generates recovered clocks. Such clock recovering operation is executed without generating a jitter. Herein, although it is explained as an example of generating the recovered clocks in which rising edges are aligned at the centers of the detected edges that are generated, without limitations.

Practically, the feedback is generally accompanied with a delay. In spite of the delay, for stable operation of the DFE, the feedback finishes within a predetermined time through the feedback loops 30A and 30B. As an example, the feedback has to be done within a UI (Unit Interval), which means one cycle of a data rate. Therefore, the feedback through the first feedback loop 30A in the DFE shown in FIG. 1 is needed to be done within ½ UI. For example, if the data rate is 1 Gbps (Giga bit per second), the 1UI should be 1 ns (nanosecond) and therefore the feedback through the first feedback loop 30A is to be finished within 0.5 ns. As the data rate increases, it is difficult to satisfy the need of the stable feedback.

Figure 3:
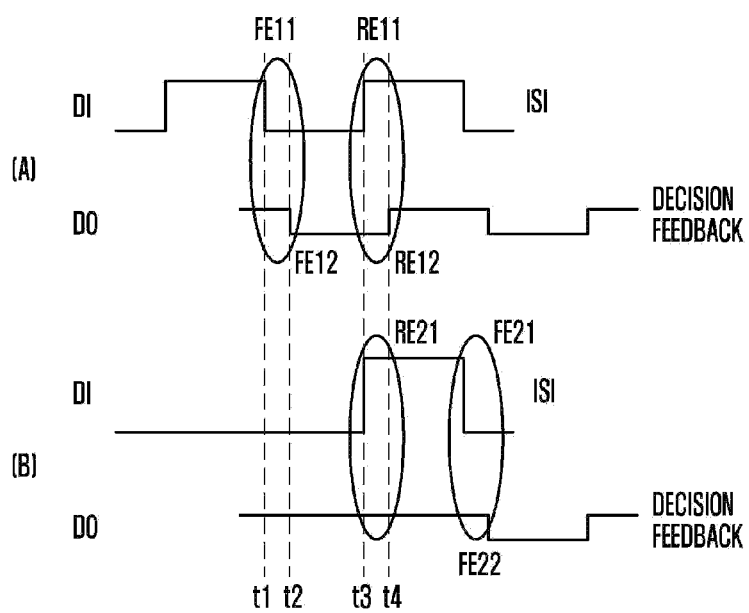
FIG. 3 is a practical operation timing diagram in the DFE illustrated in FIG. 1.

One example of data patterns for a practical case accompanied with the delay in the feedback is shown in FIG. 3. With respect to any moment of data for the decision, the data patterns are classified into cases t2 and t4 with data transition prior to a window with a size previously defined from the reference time and cases without the data transition. If the data for decision has the transition, fed back data also has the transition (is transited) and the equalization data outputted from the combiner 10 shown in FIG. 1 has edges which are pushed backwards as much as the feedback delay (t2 and t4 in FIG. 3(A)). On the other hand, if the data for decision does not have the transition, the data that is decided and then fed back along with the equalization data, they are not influenced by the feedback delay (t2 in FIG. 3(B)).

Meanwhile, the clock recovery circuit 40 shown in FIG. 1 is configured to recover the clocks by tracking all the edges of the equalization data, Referring to FIG. 3(A), a phase detector of the clock recovery circuit 40 detects a falling edge FE11 at a time t1, a falling edge FE12 at a time t2, a rising edge RE11 at a time t3 and a rising edge RE12 at a time t4. Although the edges FE12 and RE12 are the same as the edges FE11 and RE11 respectively, the clock recovery circuit 40 recovers the clocks by tracking the edges FE12 and RE12 influenced by the feedback delay as well as the edges FE11 and RE11. Thus-recovered clocks have large jitters and the data, which is fed back in response to the clocks, has larger feedback delay, thereby pushing back the edges of the equalization data more.

Figure 4:
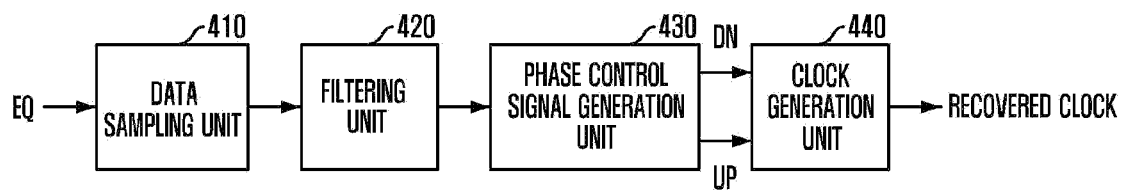
FIG. 4 is a block diagram illustrating a clock recovery circuit in accordance with an embodiment of the present invention.

The clock recovery circuit 40 in accordance with the embodiment of the present invention is configured as shown in FIG. 4. The clock recovery circuit 40 prevents performance deterioration of the DFE by filtering the edges that are pushed backward as shown in FIG. 3.

In accordance with one aspect of the present invention, the clock recovery circuit 40 detects whether an edge exists prior to the window with the size previously predefined at each of the edges of the equalization data EQ outputted from the combiner 10 shown in FIG. 1. The clock recovery circuit 40 recovers the clocks with respect to only the edges that are not detected. The recovered clocks are supplied for decision operation of the decision circuits 20A and 20B shown in FIG. 1.

For example, the clock recovery circuit 40 detects whether the edge exists prior to the window with the size previously defined at each of the edges of the equalization data EQ when the equalization data EQ of patterns as shown in FIG. 3(A) is inputted. Because the equalization data EQ includes both received data DI components and feedback data DO components, the clock recovery circuit 40 performs detection in an edge order of FE11→FE12→RE11→RE12. No edges are detected prior to the window mentioned above, at the falling edge FE11 or prior to the window mentioned above, at the rising edge RE11. However, the edge FE11 is detected prior to the window mentioned above, at the falling edge FE12, as well as the edge RE11 prior to the window mentioned above, at the rising edge RE12.

For another example, the clock recovery circuit 40 detects whether the edge exists prior to the window with the size previously defined at each of the edges of the equalization data EQ when the equalization data EQ of patterns as shown in FIG. 3(B) is inputted. Because, the equalization data EQ includes both the received data DI components and the feedback data DO components, the clock recovery circuit 40 performs detection in an edge order of RE21→FE21→FE22. Edges are not detected prior to the window at the rising edge RE21 and at the falling edge FE21. However, the edge FE21 is detected prior to the window mentioned above, at the falling edge FE22.

When the edge exists prior to the window at each of the edges of the equalization data EQ, the clock recovery circuit 40 disregards the corresponding edges FE12, RE12, and FE22.

In accordance with another aspect of the present invention, the clock recovery circuit 40 detects whether an edge of the feedback data DO component exists within the window with the size previously defined at each edge of the received data DI components of the equalization data EQ, outputted from the combiner 10 shown in FIG. 1. The clock recovery circuit 40 recovers the clocks with respect to the edges of the received data DI components and the other edges of the feedback data DO components except the detected edge. The recovered clocks are supplied for decision operation of the decision circuits 20A and 20B shown in FIG. 1.

For example, the clock recovery circuit 40 detects whether the edge of the feedback data DO component exists within the window with the size previously defined at each of the edges FE11 and RE11 of the received data DI components of the equalization data EQ, when the equalization data EQ of patterns as shown in FIG. 3(A) is inputted. The clock recovery circuit 40 performs detection in an edge order of FE11→RE11. An edge FE12 is detected within the window at the falling edge FE11. An edge RE12 is detected within the window at the rising edge RE11.

For another example, the clock recovery circuit 40 detects whether the edge of the feedback data DO component exists within the window with the size previously defined at each of the edges RE21 and FE21 of the received data DI components of the equalization data EQ, when the equalization data EQ of patterns as shown in FIG. 3(B) is inputted. Edges are not detected within the window at the rising edge RE21. An edge FE22 is detected within the window at the falling edge FE21.

When the edge of the feedback data DO component exists within the window at each of the edges of the received data DI components, the clock recovery circuit 40 disregards the corresponding edges FE12, RE12, and FE22.

Referring to FIG. 4, the clock recovery circuit 40 includes a data sampling unit 410, a filtering unit 420, a phase control signal generation unit 430, and a clock generation unit 440. The data sampling unit 410 receives and samples the equalization data EQ outputted from the combiner 10 shown in FIG. 1. The filtering unit 420 receives and filters output of the data sampling unit 410 to output it. The phase control signal generation unit 430 receives output of the filtering unit 420 and generates a control signal for controlling a phase of the clock generated by the clock generation unit 440. The phase control signal generation unit 430 generates a control signal DN for delaying the phase of the clock generated by the clock generation unit 440 or a control signal UP for advancing the phase of the clock generated by the clock generation unit 440. The clock generation unit 440 generates the same clocks as the clocks used for decision operation of the decision circuits 20A and 20B shown in FIG. 1. The clock generation unit 440 may include a PLL (Phase Locked Loop) or a VCO (Voltage Controlled Oscillator).

In accordance with one aspect, the filtering unit 420 receives output of the data sampling unit 410, filters the corresponding edges in cases where edges exist prior to the window at each of the edges of the equalization data EQ, and outputs the other edges. The phase control signal generation unit 430 receives the other edges and generates the control signals DN/UP for controlling the phases of the clocks generated by the clock generation unit 440.

In accordance with another aspect, the filtering unit 420 filters the corresponding edges if the edges of the feedback data DO components exist within the window at each of the edges of the received data DI components of the equalization data EQ and outputs the edges of the received data DI components and the other edges of the feedback data DO components except the filtered edges. The phase control signal generation unit 430 receives the edges outputted from the filtering unit 420 and generates the control signals DN/UP for controlling the phases of the clocks.

Figure 5:
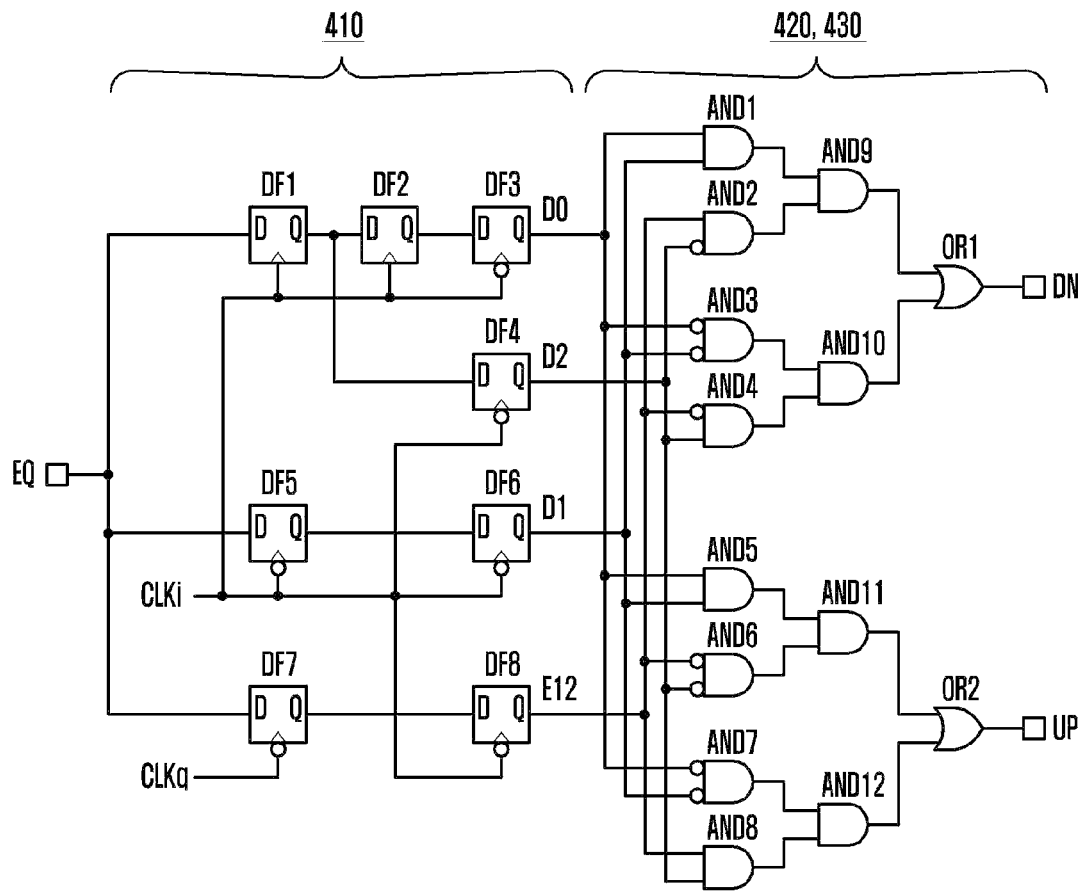
FIG. 5 is a diagram illustrating a detail configuration of the clock recovery circuit illustrated in FIG. 4.

FIG. 5 is a diagram illustrating a detail configuration of the clock recovery circuit 40 in accordance with the embodiment of the present invention. The clock recovery circuit 40 performs edge-filtering operation in accordance with the embodiment of the present invention by filtering centers and the edges of the equalization data through the data sampling unit 410, filtering edges of data to be tracked through the filtering unit 420, and generating the signals for controlling the phases of the clocks through the phase control signal generation unit 430.

Referring to FIG. 5, the clock recovery circuit includes 8 D flip-flops DF1 to DF8, 12 AND gates AND1 to AND12, and 2 OR gates OR1 and OR2. The D flip-flop DF1 includes an input terminal D connected to an output terminal of the combiner 10 shown in FIG. 1 and an output terminal Q. The D flip-flop DF1 inputs the equalization data EQ through the input terminal D and outputs the equalization data EQ through the output terminal Q in response to a clock CLKi. The D flip-flop DF2 includes an input terminal D connected to the output terminal Q of the D flip-flop DF1 and an output terminal Q. The D flip-flop DF2 inputs output data from the D flip-flop DF1 through the input terminal D and outputs the inputted data through the output terminal Q in response to the clock CLKi. The D flip-flop DF3 includes an input terminal D connected to the output terminal Q of the D flip-flop DF2 and an output terminal Q. The D flip-flop DF3 inputs output data from the D flip-flop DF2 through the input terminal D and outputs the inputted data through the output terminal Q in response to an inverted result of the clock CLKi. Data outputted from the D flip-flop DF3 is DO. The clock CLKi for data detection is supplied to the decision circuits 20A and 20B shown in FIG. 1. The following CLKq is a clock for edge detection and has a phase difference of 90 from the clock CLKi.

The D flip-flop DF4 includes an input terminal D connected to the output terminal Q of the D flip-flop DF1 and an output terminal Q. The D flip-flop DF4 inputs output data from the D flip-flop DF1 through the input terminal D and outputs the inputted data through the output terminal Q in response to the inverted result of the clock CLKi. Data outputted from the D flip-flop DF4 is D2.

The D flip-flop DF5 includes an input terminal D connected to the output terminal of the combiner 10 shown in FIG. 1 and an output terminal Q. The D flip-flop DF5 inputs the equalization data EQ through the input terminal D and outputs the equalization data EQ through the output terminal Q in response to the inverted result of the clock CLKi. The D flip-flop DF6 includes an input terminal D connected to the output terminal Q of the D flip-flop DF5 and an output terminal Q. The D flip-flop DF6 inputs output data from the D flip-flop DF5 through the input terminal D and outputs the inputted data through the output terminal Q in response to the inverted result of the clock CLKi. Data outputted from the D flip-flop DF6 is D1.

The D flip-flop DF7 includes an input terminal D connected to the output terminal of the combiner 10 shown in FIG. 1 and an output terminal Q. The D flip-flop DF7 inputs the equalization data EQ through the input terminal D and outputs the equalization data EQ through the output terminal Q in response to the inverted result of the clock CLKi. The D flip-flop DF8 includes an input terminal D connected to the output terminal Q of the D flip-flop DF7 and an output terminal Q. The D flip-flop DF8 inputs output data from the D flip-flop DF7 through the input terminal D and outputs the inputted data through the output terminal Q in response to the inverted result of the clock CLKi. Data outputted from the D flip-flop DF8 is E12.

The AND gate AND1 includes two input terminals and one output terminal and AND-gating operates the data D0 and the data D1 to output the operated result. The AND gate AND2 includes two input terminals and one output terminal and AND-gating operates inverted results of the data E12 and the data D2 to output the operated result. The AND gate AND3 includes two input terminals and one output terminal and AND-gating operates an inverted result of the data D0 and an inverted result of the data D1 to output the operated result. The AND gate AND4 includes two input terminals and one output terminal and AND-gating operates the inverted result of the data E12 and the data D2 to output the operated result. The AND gate AND5 includes two input terminals and one output terminal and AND-gating operates the data D0 and the data D1 to output the operated result. The AND gate AND6 includes two input terminals and one output terminal and AND-gating operates the inverted result of the data E12 and the inverted result of the data D2 to the operated result. The AND gate AND7 includes two input terminals and one output terminal and AND-gating operates the inverted result of the data D0 and the inverted result of the data D1 to output the operated result. The AND gate AND8 includes two input terminals and one output terminal and AND-gating operates the data E12 and the data D2 to output the operated result.

The AND gate AND9 includes two input terminals and one output terminal and AND-gating operates output of the AND gate AND1 and output of the AND gate AND2 to output the operated result. An AND gate AND10 includes two input terminals and one output terminal and AND-gating operates output of the AND gate AND3 and output of the AND gate AND4 to output the operated result. An AND gate AND11 includes two input terminals and one output terminal and AND-gating operates output of the AND gate AND5 and output of the AND gate AND6 to output the operated result. An AND gate AND12 includes two input terminals and one output terminal and AND-gating operates output of the AND gate AND7 and output of the AND gate AND8 to output the operated result.

The OR gate OR1 includes two input terminals and one output terminal and OR-gating operates output of the AND gate AND9 and output of the AND gate AND10 to output the operated result. An output signal of the OR gate OR1 is a down-control signal DN for controlling the phase of the clock, which is generated through the clock generation unit 340 shown in FIG. 5, to be late generated. The OR gate OR2 includes two input terminals and one output terminal and OR-gating operates and outputs output of the AND gate AND11 and output of the AND gate AND12. An output signal of the OR gate OR2 is an up-control signal UP for controlling the phase of the clock, which is generated through the clock generation unit 340 shown in FIG. 5, to be early generated.

Figure 6:
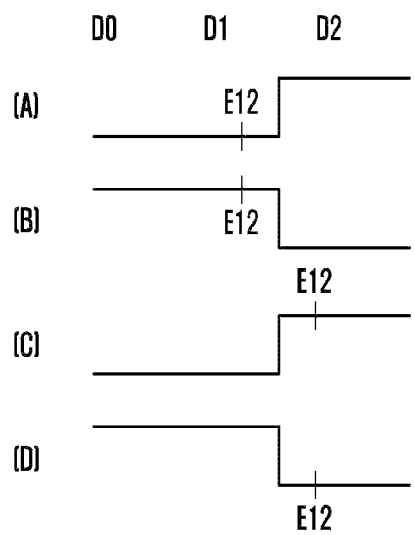
FIG. 6 is a timing diagram illustrating results sampled by a data sampling unit illustrated in FIG. 5.
Figure 7A:
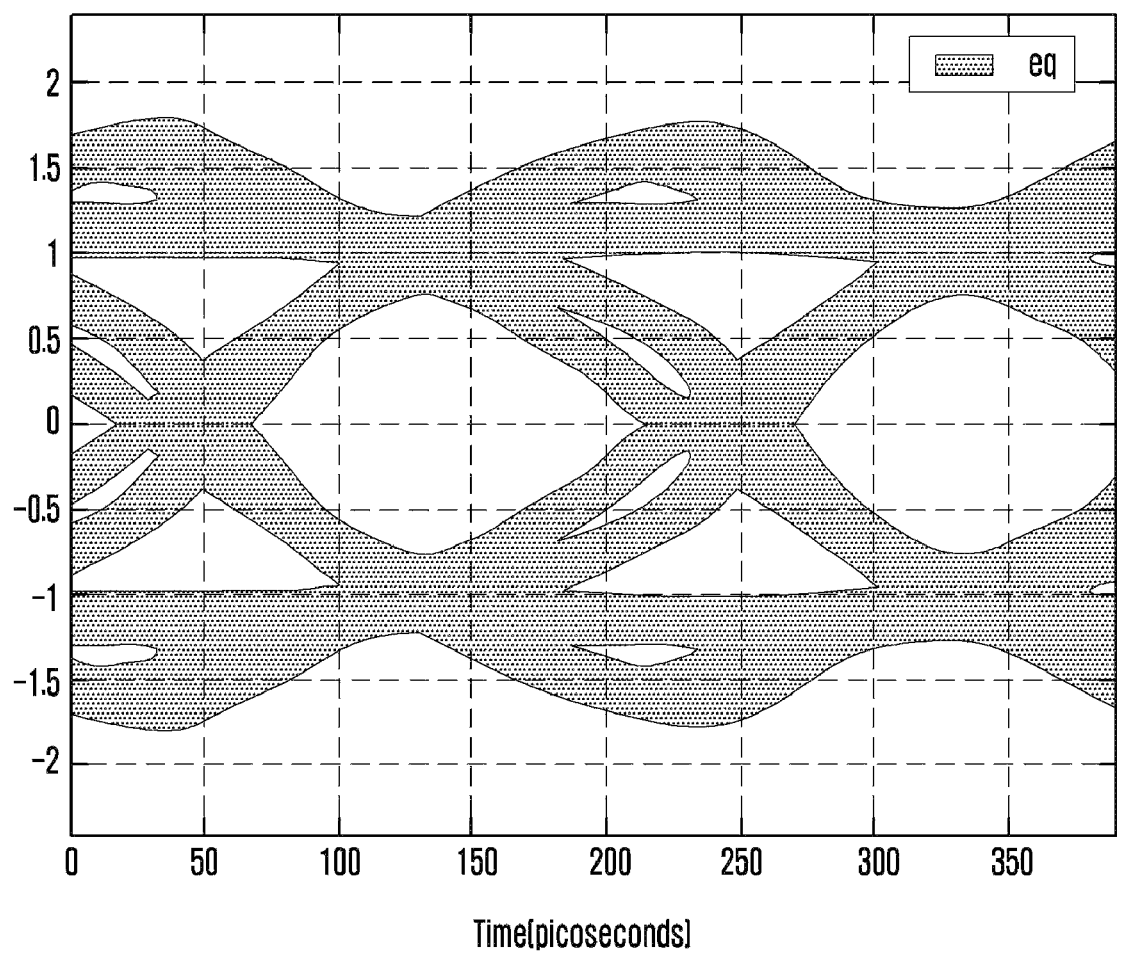
FIGS. 7 to 8 are diagrams illustrating simulation results of a conventional DFE and a DFE in accordance with the embodiment of the present invention.
Figure 7B:
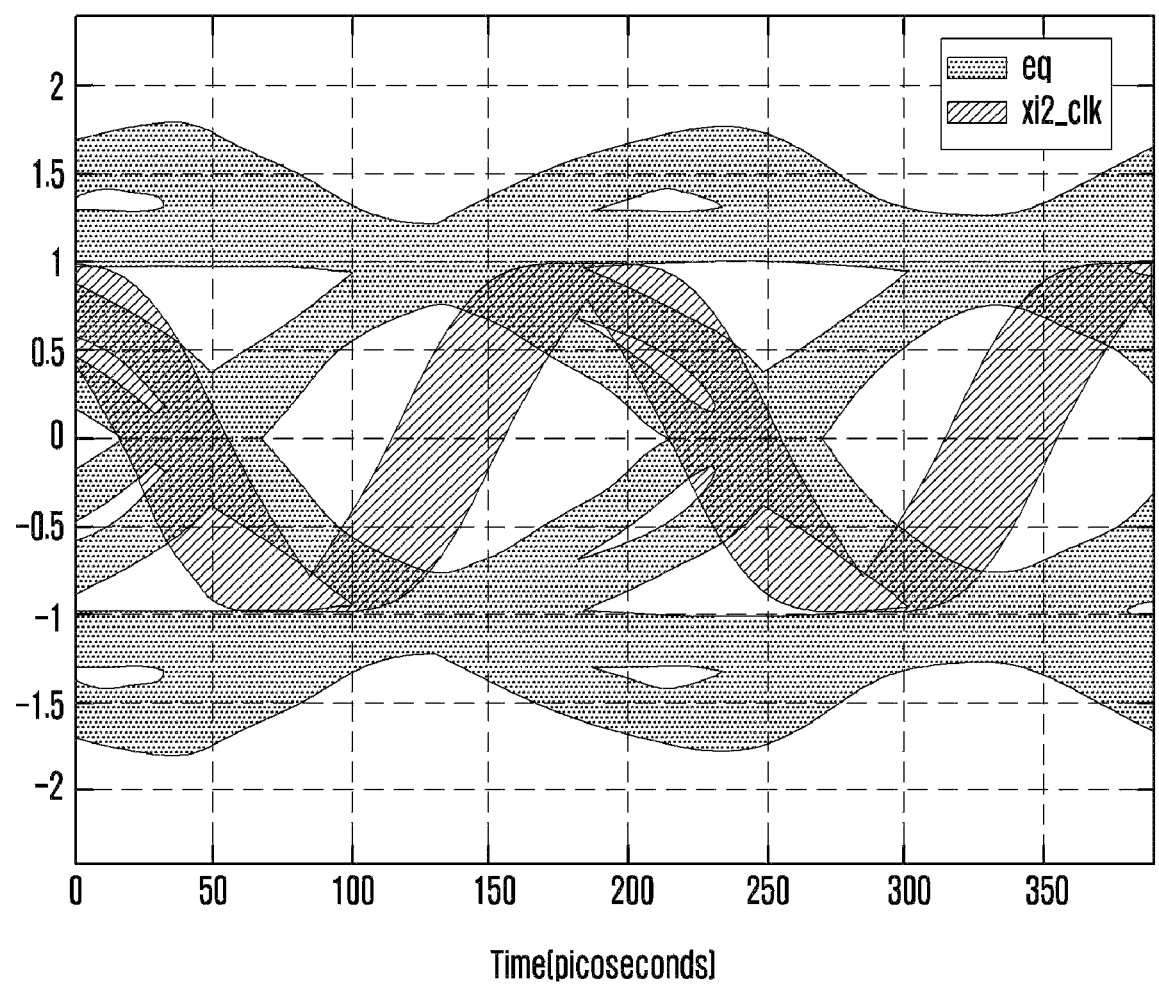
Figure 7C:
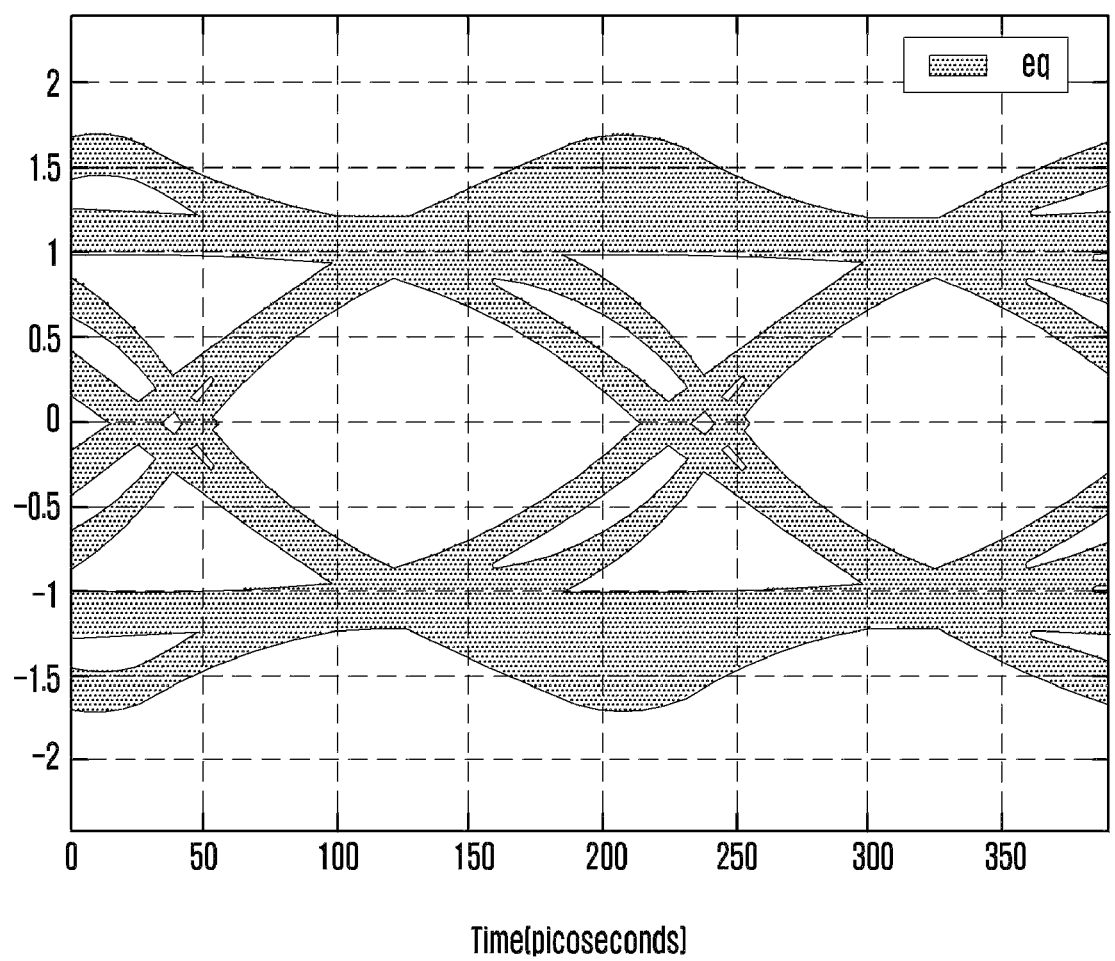
Figure 7D:
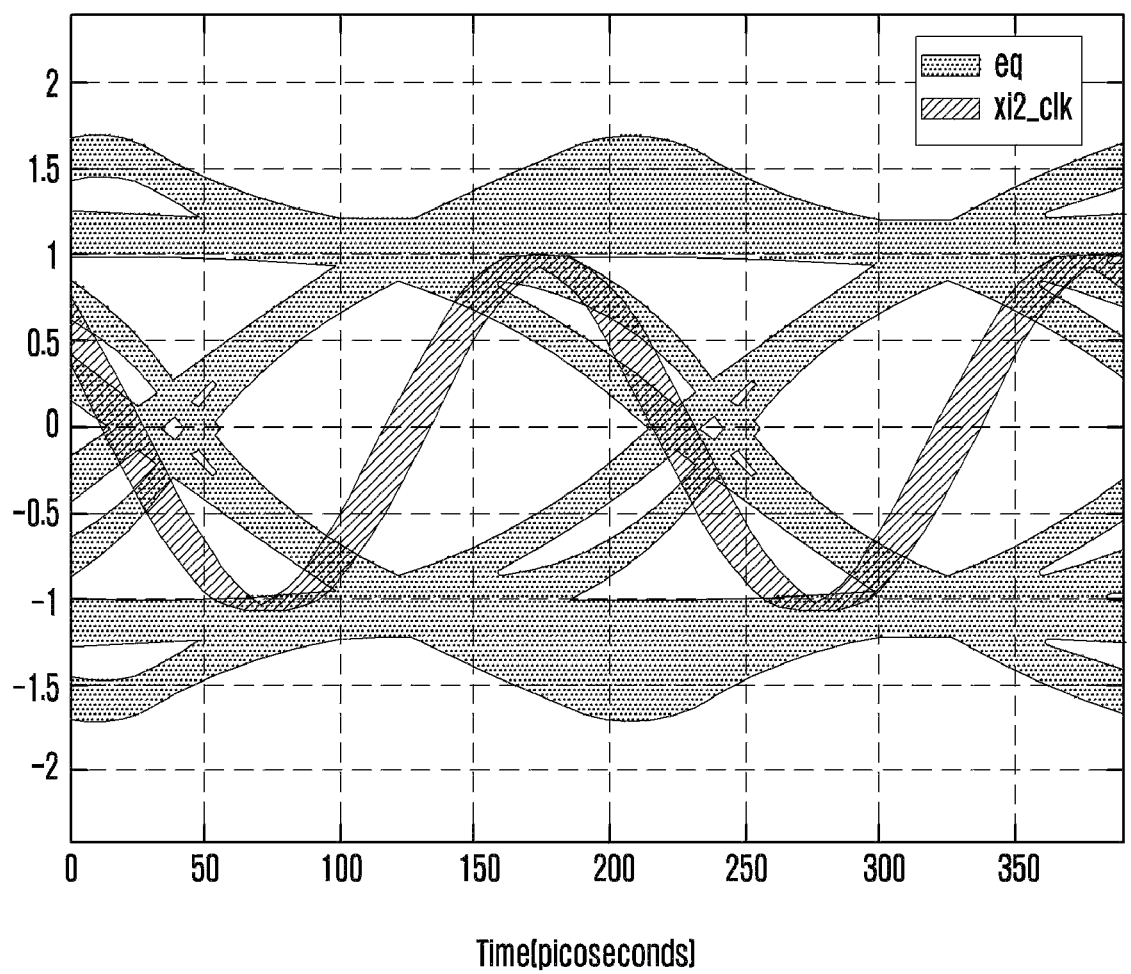

A timing diagram for results sampled by the data sampling unit 410 configured as shown in FIG. 5 is shown in FIG. 6 and corresponding values of the sampling data D0, D1, D2, and the edge data E12 are described in the following Table 1.

TABLE 1

| CASE | D0 | D1 | D2 | E12 | PHASE |
|---|---|---|---|---|---|
| Case1 | 0 | 0 | 1 | 0 | early |
| Case2 | 1 | 1 | 0 | 1 | early |
| Case3 | 0 | 0 | 1 | 1 | late |
| Case4 | 1 | 1 | 0 | 0 | late |

Referring to Table 1, in case of D0=0, D1=0, D2=1, E12=0, the edge E12 of the feedback data is detected at a time prior to transition of the received data from a low level to a high level (Case1, refer to FIG. 6(A)). In case of D0=1, D1=1, D2=0, and E12=1, the edge E12 of the feedback data is detected at a time prior to transition of the received data from a high level to a low level (Case2, refer to FIG. 6(B)). In case of D0=0, D1=0, D2=1, and E12=1, the edge E12 of the feedback data is detected at a time after the transition of the received data from the low level to the high level (Case3, refer to FIG. 6(C)). In case of D0=1, D1=1, D2=0, and E12=0, the edge E12 of the feedback data is detected at a time after the transition of the received data from the high level to the low level (Case4, refer to FIG. 6(D)). Because, in the Case1 and Case2, the edges of the feedback data are detected prior to the time of the transition of the received data, that is, when the phases of the clocks are early, the phases of the clocks are needed to be delayed. In this case, the phase control signal generation unit 430 generates the down-control signal DN. Because, in the Case3 and Case4, the edges of the feedback data are detected after the time of the transition of the received data, that is, when the phases of the clocks are late, the phases of the clocks are needed to be advanced. In this case, the phase control signal generation unit 430 generates the up-control signal UP.

Figure 8:
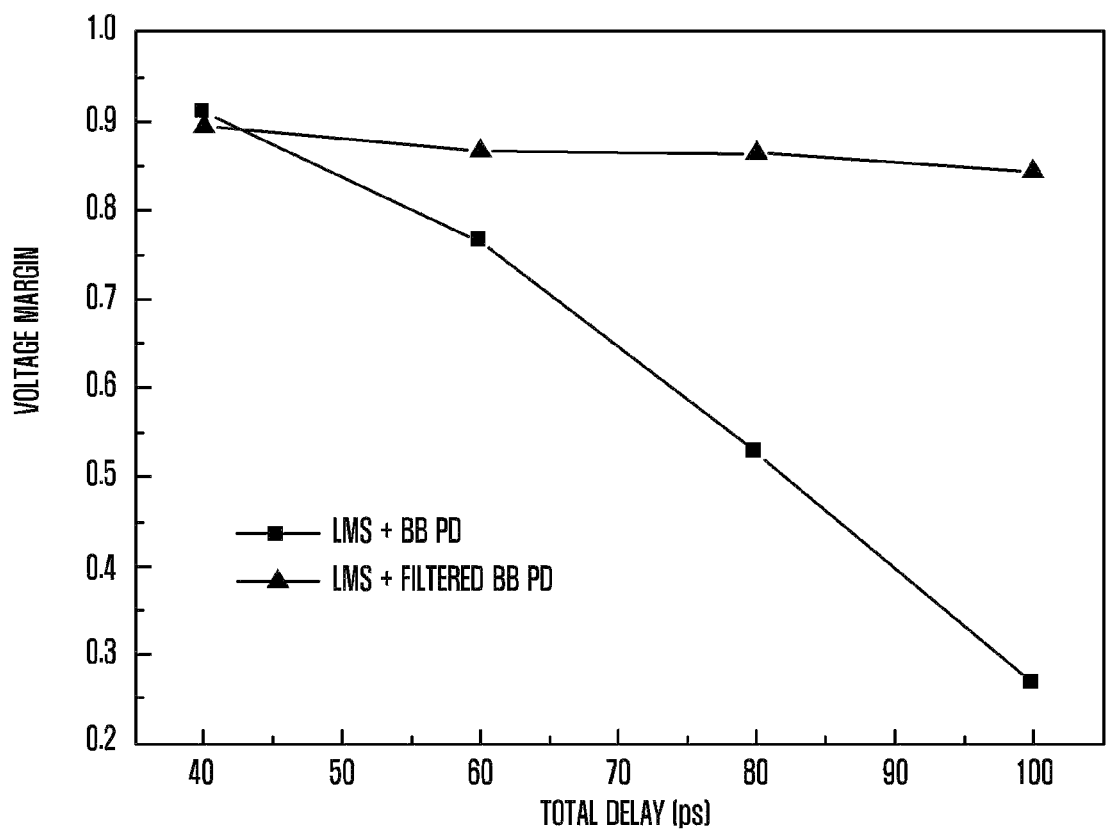

Simulation results of the conventional DFE and the DFE in accordance with the embodiment of the present invention are shown in FIGS. 7 to 8.

FIG. 7 illustrates a result of behavior simulation for the equalization data and the recovered clocks when optimizing a tap coefficient by using an LMS (Least Mean Square) algorithm in the DFE. Referring to FIGS. 7(A) and 7(B), in the conventional DFE, as jitters accumulate in both the equalization data (represented by "eq") and the recovered clocks (represented by xi2_clk), a margin of decided data is remarkably reduced. On the other hand, referring to FIGS. 7(C) and 7(D), the DFE in accordance with the embodiment of the present invention can prevent performance deterioration by reducing the jitters of the equalization data and the recovered clocks.

FIG. 8 illustrates a result of simulating a data margin according to feedback delay when the DFE in accordance with the embodiment of the present invention receives data with a data rate of 5 Gbps. As the feedback delay increases, the conventional DFE (represented by LMS+BB (Bang Bang)+PD (Phase Detector)), remarkably reduces the data margin in comparison with the DFE (represented by LMS+Filtered BB PD), in accordance with the embodiment of the present invention in which the filtering is performed.

As described above, the embodiment of the present invention can reduce the performance deterioration of the DFE by removing the edge of the feedback data which is pushed backward due to the feedback delay in the DFE of the high speed serial communication system. That is, it is possible to reduce the jitters of the recovered clocks and improve the voltage margin of the decided data.

In accordance with the above-mentioned embodiments, the clock recovery circuit, as shown in FIG. 5, includes a plurality of D flip-flops, AND gates, and OR gates, although a performance of filtering the edges of the data components due to the feedback delay after sampling the equalization data may be implemented by other components. Furthermore, the above-mentioned embodiments are implemented in the DFE as shown in FIG. 1, although they may be implemented in a DFE having different components from those as shown in FIG. 1.

Preferred embodiments of the present invention relate to a DFE of a high speed serial communication system capable of reducing jitter in a recovered clock and improving a voltage margin of decided data by removing edges of the feedback data which are pushed backward due to feedback delay.

While the present invention has been described with respect to the specific embodiments, it will be apparent to those skilled in the art that various changes and modifications may be made without departing from the spirit and scope of the invention as defined in the following claims.

What is claimed is:

1. A decision feedback equalizer for a high speed serial communication system, comprising: a combiner configured to combine received data with feedback data and output the combined data as equalization data; a decision circuit configured to decide recovery data by receiving the equalization data; a feedback loop configured to supply the recovery data to the combiner as feedback data; and a clock recovery circuit configured to detect whether edges exist prior to a window with a size previously defined at each edge of the equalization data, recover a clock with respect to only the edges not detected and supply the recovered clock for decision operation of the decision circuit, wherein the clock recovery circuit disregards the corresponding edges when the edges exist prior to the window at each of the edges of the equalization data.

2. The decision feedback equalizer of claim 1, wherein the clock recovery circuit includes:
a clock generation unit configured to generate a clock for decision operation of the decision circuit;
a data sampling unit configured to sample the equalization data;
a filtering unit configured to receive output of the data sampling unit, filter the corresponding edges in cases where the edges exist prior to the window at each of the edges of the equalization data and output the other edges; and
a phase control signal generation unit configured to receive the other edges and generate a control signal for controlling a phase of the clock.

3. A decision feedback equalizer for a high speed serial communication system, comprising: a combiner configured to combine received data with feedback data and output the combined data as equalization data; a decision circuit configured to decide recovery data by receiving the equalization data; a feedback loop configured to supply the recovery data to the combiner as feedback data; and a clock recovery circuit configured to detect whether edges of feedback data components exist within a window with a size previously defined at each edge of received data components of the equation data, recover a clock with respect to the edges of the received data components and the other edges of the feedback data components except the detected edges and supply the recovered clock for decision operation of the decision circuit, wherein the clock recovery circuit disregards the corresponding edges when the edges of the feedback data components exist within the window at each of the edges of the received data components.

4. The decision feedback equalizer of claim 3, wherein the clock recovery circuit includes:
a clock generation unit configured to generate a clock for decision operation of the decision circuit;
a data sampling unit configured to sample the equalization data;
a filtering unit configured to filter the corresponding edges if the edges of the feedback data components exist within the window at each of the edges of the received data components of the equalization data and output the edges of the received data components and the other edges of the feedback data components except the filtered edges; and
a phase control signal generation unit configured to receive the edges outputted from the filtering unit and generate a phase control signal for controlling a phase of the clock.

5. A decision feedback equalizer for a high speed serial communication system, comprising: a combiner configured to combine received data with feedback data and output the combined data as equalization data; a decision circuit configured to decide recovery data by receiving the equalization data; a feedback loop configured to supply the recovery data to the combiner as feedback data; and a clock recovery circuit configured to remove a delay data component from the equalization data through the feedback loop, recover a clock with respect to the other equalization data except the delay data component and supply the recovered clock for decision operation of the decision circuit, wherein the clock recovery circuit detects whether edges exist prior to a window with a size previously defined at each edge of the equalization data and recovers the clock with respect to only the undetected edges.

6. The decision feedback equalizer of claim 5, wherein the clock recovery circuit disregards the corresponding edges if the edges exist prior to the window at each of the edges of the equalization data.

7. The decision feedback equalizer of claim 5, wherein the clock recovery circuit includes:
a clock generation unit configured to generate a clock for decision operation of the decision circuit;
a data sampling unit configured to sample the equalization data;
a filtering unit configured to receive output of the data sampling unit, filter the corresponding edges in cases where the edges exists prior to the window at each of the edges of the equalization data and output the other edges; and
a phase control signal generation unit configured to receive the other edges and generate a control signal for controlling a phase of the clock.

8. The decision feedback equalizer of claim5, wherein the clock recovery circuit detects whether edges of feedback data components exist within a window with a size previously defined at each edge of received data components of the equation data and recovers a clock with respect to the edges of the received data components and the other edges of the feedback data components except the detected edges.

9. The decision feedback equalizer of claim 8, wherein the clock recovery circuit disregards the corresponding edges if the edges of the feedback data components exist within the window at each of the edges of the received data components.

10. The decision feedback equalizer of claim 8, wherein the clock recovery circuit includes:
a clock generation unit configured to generate a clock for decision operation of the decision circuit;
a data sampling unit configured to sample the equalization data;
a filtering unit configured to filter the corresponding edges in cases where the edges of the feedback data components exist within the window at each of the edges of the received data components of the equalization data and output the edges of the received data components and the other edges of the feedback data components except the filtered edges; and
a phase control signal generation unit configured to receive the edges outputted from the filtering unit and generate a phase control signal for controlling a phase of the clock.

11. A method for recovering a clock of a decision feedback equalizer for a high speed serial communication system provided with a combiner configured to combine received data with feedback data and output the combined data as equalization data, a decision circuit configured to decide recovery data by receiving the equalization data and a feedback loop configured to supply the recovery data to the combiner as feedback data, comprising: removing a delay data component from the equalization data through the feedback loop and recovering a clock with respect to the other equalization data except the delay data component; and supplying the recovered clock for decision operation of the decision circuit, wherein, in recovering the clock, determine when edges exist prior to a window with a size previously defined at each edge of the equalization data is detected and the clock is recovered with respect to only the edges not detected; further comprising: disregarding the corresponding edges in cases where the edges exist prior to the window at each of the edges of the equalization data.

12. The method of claim 11, wherein recovering the clock includes:
- generating the clock for decision operation of the decision circuit;
- sampling the equalization data;
- receiving the sampled data, filtering the corresponding edges in cases where the edges exist prior to the window at each of the edges of the equalization data and outputting the other edges; and
- receiving the other edges and generating a control signal for controlling a phase of the clock.

13. The method of claim 11, wherein, in recovering the clock, determine if edges of feedback data components exist within a window with a size previously defined at each edge of received data components of the equalization data is detected and the clock is recovered with respect to the edges of the received data components and the other edges of the feedback data components except the detected edge.

14. The method of claim 13, further comprising:
- disregarding the corresponding edges if the edges of the feedback data components exist within the window at each of the edges of the received data components.

15. The method of claim 13, wherein recovering the clock includes:
- generating the clock for decision operation of the decision circuit;
- sampling the equalization data;
- receiving the sampled data, filtering the corresponding edges if the edges of the feedback data components exist within the window at each of the edges of the received data components of the equalization data and outputting the edges of the received data components and the other edges of the feedback data components except the filtered edge; and
- receiving the edges outputted from the filtering unit and generating a control signal for controlling a phase of the clock.

\* \* \* \* \*